United States Patent [19]
Kashio et al.

[11] Patent Number: 5,688,632
[45] Date of Patent: Nov. 18, 1997

[54] PHOTOSENSITIVE POLYMER COMPOSITION CONTAINING A SOLUBLE POLYMER OF ISLANDS-IN-A-SEA STRUCTURE, A PHOTOPOLYMERIZABLE POLYMER, AND A PHOTOPOLYMERIZATION INITIATOR

[75] Inventors: Shigetora Kashio; Katsutoshi Sasashita; Tomio Adachi, all of Aichi, Japan

[73] Assignee: Toray Industries, Inc., Japan

[21] Appl. No.: 277,922

[22] Filed: Jul. 20, 1994

[30] Foreign Application Priority Data

Jul. 20, 1993 [JP] Japan .................................. 5-178849

[51] Int. Cl.$^6$ .................................................. G03C 1/73
[52] U.S. Cl. .................. 430/281.1; 430/286.1; 430/288.1; 430/271.1; 522/141; 522/144; 522/111; 522/112; 522/85
[58] Field of Search .................. 430/281, 906, 430/286, 288, 271.1; 522/141, 144, 111, 112, 85

[56] References Cited

U.S. PATENT DOCUMENTS 5,372,913  12/1994  Nanpei et al. ...................... 430/281

FOREIGN PATENT DOCUMENTS

| 56-36511 | 4/1981 | Japan . |
| 57-32441 | 2/1982 | Japan . |
| 57-45535 | 3/1982 | Japan . |
| 3-41459 | 2/1991 | Japan . |
| 3-42671 | 2/1991 | Japan . |
| 5-210241 | 8/1993 | Japan . |

Primary Examiner—George F. Lesmes
Assistant Examiner—Laura Weiner
Attorney, Agent, or Firm—Austin R. Miller

[57] ABSTRACT

This invention relates to a photosensitive polymer composition containing as essential components (A) a soluble polymer, (B) a photopolymerizable compound having an ethylenic double bond in the molecule there of and (C) a photopolymerization initiator, the soluble polymer comprising a water-soluble polymer and an alcohol-soluble polymer, the composition having a sea-and-islands structure comprising sea containing the water-soluble polymer as a main component and islands containing the alcohol-soluble polymer as a main component, and the islands are independently in the form of sphere or oval having a diameter of 0.1 to 20 microns.

The photosensitive polymer composition affords a printing plate having high image reproducibility and water-developability and capable of withstanding the coating of an aqueous polymer according to a printing method.

14 Claims, 2 Drawing Sheets

COMPARATIVE EXAMPLE

COMPARATIVE EXAMPLE

PHOTOSENSITIVE POLYMER COMPOSITION CONTAINING A SOLUBLE POLYMER OF ISLANDS-IN-A-SEA STRUCTURE, A PHOTOPOLYMERIZABLE POLYMER, AND A PHOTOPOLYMERIZATION INITIATOR

BACKGROUND OF THE INVENTION

1. Field of the Invention

The present invention relates to a photosensitive polymer composition, particularly a photosensitive polymer composition which affords a photosensitive polymer printing plate for coating an aqueous varnish (a resin solution obtained by dissolving a resin in a solvent containing water as a main component on the surface of a printed matter according to a printing method.

2. Description of the Prior Art

As is known well, with the recent grade-up of printed matter it has become popular to apply varnish (called varnishing) to the surface of printed matter after ordinary color printing for the purpose of glazing or for enhancing the resistance to water and to weather of the printed matter. As a recent tendency, the method of applying varnish to only part of a pattern (called partial or spot varnishing) according to a printing method has been spreading in quick tempo. On the other hand, in point of characteristics of varnish, a shift is being made rapidly from the conventional oil varnish using a resin dissolved in an organic solvent to an aqueous varnish using a resin dissolved in water as a main component from a world-wide standpoint of eliminating environmental pollution or protecting the earth environment. Also in other fields than the field of aqueous varnish coat printing, an aqueous resin coating is spreading rapidly.

In the above uses there usually is employed a photosensitive rubber printing plate or an alcohol washing-out photosensitive resin plate. However, the use of a photosensitive rubber printing plate involves the problem of using an organic solvent which exerts a bad influence on the human body and the earth environment in the washing-out process for plate making. Also in the case of an alcohol washing-out photosensitive resin plate, there is encountered a problem of using ethyl alcohol which is highly flammable in the washing-out process. Such problems are great obstacles to the popularization of those printing plates.

For avoiding the above problems it is desired to use a water-developable photosensitive polymer plate which does not require the use of an organic solvent or an alcoholic solvent in the washing-out process. However, a water-developed printing plate usually swells in water, and so is not employable in the coating of an aqueous polymer according to a printing method.

JP4-3162A discloses a photosensitive polymer composition having a sea-and-islands structure. This can attain improvement in image reproducibility in some extent but is not satisfactory in fine image reproducibility.

The present inventors have found that by using a combination of a water-soluble polyamide and an alcohol-soluble polyamide at a specific ratio as a soluble polymer in a photosensitive polymer composition there is obtained a photosensitive polymer printing plate which is water-developable and has water resistance (JP5-210 241A).

SUMMARY OF THE INVENTION

According to the above techniques, indeed there has been attained improvement in water resistance, but it has been impossible to obtain a printing plate which is fully satisfactory in image reproducibility and water-developability.

The present invention has been accomplished in view of the aforementioned drawbacks of the prior art and it is the object of the invention to provide a photosensitive polymer composition which affords a photosensitive polymer printing plate having high image reproducibility and water-developability and capable of withstanding the coating of an aqueous polymer according to a printing method.

The present invention resides in a photosensitive polymer composition containing as essential components (A) a soluble polymer, (B) a photopolymerizable compound having an ethylenic double bond in the molecule thereof and (C) a photopolymerization initiator, said soluble polymer comprising a water-soluble polymer and an alcohol-soluble polymer, said composition having a phase separating structure of a sea-and-islands form composed of sea containing the water-soluble polymer as a main component and islands containing the alcohol-soluble polymer as a main component, and said islands are independently in the form of spheres or ovals each having a diameter of 0.1 to 20 microns. Preferably, the whole or a portion of the water-soluble polymer or the alcohol-soluble polymer is a modified nylon (hereinafter referred to simply as "modified nylon") obtained by chemically modifying an N-alkoxymethylated nylon.

DESCRIPTION OF THE PREFERRED EMBODIMENTS

Figure 1:
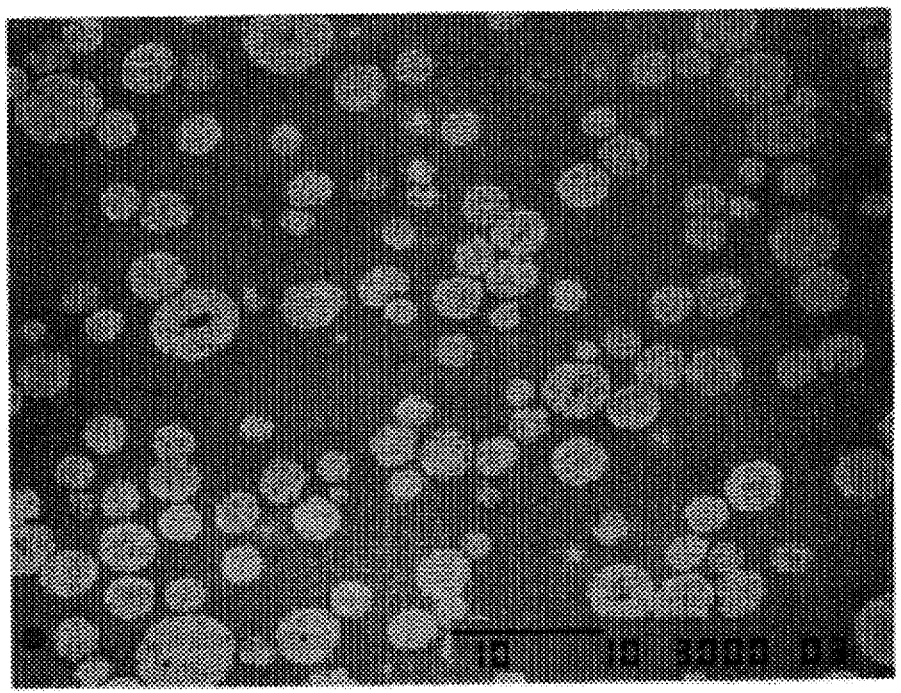
FIG. 1 is a photograph showing the dispersed structure of the printing plate material in Example 1 observed using a scanning electron microscope (×2,000).

The photosensitive polymer composition according to the present invention contains a soluble polymer, a photopolymerizable compound having an ethylenic double bond in the molecule thereof and a photopolymerization initiator.

The polymer composition has a dispersed structure of a sea-and-islands form. This structure, in any section of the polymer composition, comprises two or more components and consists principally of a continuous sea component phase of a uniform morphological phase and an island component phase comprising multiple island components different from the components of the sea component phase, the island component phase being dispersed substantially like islands in the sea component phase. The island phase is in the form of discontinuous spheres or ovals.

The diameter of the island component phase or the length of the major axis thereof is in the range of 0.1 to 20 microns. This structure results in highly improved image reproducibility as compared with known photosensitive polymer compositions having sea-and-islands structure. If it exceeds 20 microns, the islands may appear as projections on side faces or surfaces of fine dots and fine lines on a printing plate which is becoming more and more precise at present, and this may exert a bad influence on printing or pose a problem in point of an external appearance of prints obtained.

On the other hand, in the case where the islands are smaller in diameter, it has been presumed theoretically that if the spheres of the islands are in a dispersed state and if they are smaller than 0.1 micron in diameter, it will become possible to effect close filling of the island spheres, so possible to increase the amount of the island component and hence possible to improve the water resistance. Actually, however, such a small diameter is not desirable because the independently dispersed state of the island component is impaired and water-developability deteriorated. A more preferred range of the island diameter is 0.5 to 5 microns.

In the sea-and-islands structure of the resin composition according to the present invention, the island component consists principally of an alcohol-soluble polymer. In the case of using the resin composition as a printing plate material, the sea component which consists principally of a water-soluble polymer retains a neutral water-developability, while the water resistance of a photosensitive resin printing plate material is exhibited by the alcohol-soluble polyamide which constitutes the island component. Thus, there is attained a well-balanced state of neutral water-developability and water resistance which are contrary to each other. Although the water resistance of the photosensitive resin printing plate can be improved by increasing the content of the alcohol-soluble polymer, a higher content thereof results in that the island structure becomes larger and the image reproducibility of a relief image obtained is deteriorated or the sea-and-islands structure is reversed, thus making neutral water development infeasible practically.

As the soluble polymer used in the present invention there is employed a combination of a water-soluble polymer and an alcohol-soluble polymer. It is desirable to use a water-soluble polyamide and an alcohol-soluble polyamide.

The "water-soluble" property as referred to herein indicates a dissolving or dispersing property in water. According to this property, for example, when a polyamide formed in the shape of film is immersed in water at a temperature in the range of room temperature to 50° C. and rubbed with a brush or the like, the whole or a part of the polymer is dissolved out or the polymer swells and is dispersed in the water, resulting in that the film decreases its weight or collapses. Preferably, as the water-soluble polymer there is used a polymer which dissolves in water or can absorb more than 200 wt % of water and swell when a film 0.5 mm thick thereof is immerced in water at 25° C. for 1 hour.

The "alcohol-soluble" property indicates a capability of being dissolved in a lower alcohol (particularly methanol or ethanol) alone or a mixed solvent comprising a lower alcohol as a main solvent and less than 30 wt % of water, benzene, toluene, xylene, cresol, chloroform or ethyl acetate incorporated therein. Preferably, as the alcohol-soluble polymer there is used a polymer which is dissolved in ethanol or can absorb more than 200 wt % of ethanol and swell when a film 0.5 mm thick thereof is immersed in ethanol at 25° C.

Polymers having both water-solubility and alcohol-solubility are here classified as water-soluble polymers. That is, the alcohol-soluble polymer indicates a polymer which is soluble in alcohol and not soluble in water.

As the water-soluble polymer it is desirable to use a water-soluble polyamide from the standpoint of compatibility between polymers or between polymers and the photopolymerizable compound. The water-soluble polyamide is usually a non-graft or unmodified polymer which is classified separately from a water-soluble, modified nylon obtained by chemically modifying an N-alkoxymethylated nylon which will be described later.

As water-soluble polyamides employable in the present invention are included all of those proposed heretofore. Examples are polyamides having sulfonic acid or sulfonyl groups in the side chain, polyamides having tertiary amino groups (usually having baisicity) in the main or side chain, and polyamides having ether or polyether linkages in the main or side chain.

Polyamides having sulfonic acid or sulfonyl groups in the side chain can be obtained by the copolymerization of sodium 3,5-dicarboxybenzenesulfonate with an ordinary polyamide forming material, as disclosed in JP48-72250A. Polyamide having tertiary amino groups in the main or side chain can be obtained by the copolymerization of N,N'-bis(γ-aminopropyl)piperazine or α-dialkylamino-ε-caprolactam with an ordinary polyamide forming material as disclosed in in JP50-7605A. Further, polyamides having ether or polyether linkages in the main or side chain can be obtained by copolymerizing a dicarboxylic acid, a diamine or a cyclic amide, each having an ether linkage in the molecule, with a ordinary polyamide forming material, as disclosed in JP49-43465, or by copolymerizing a polyether having amino groups at both ends thereof and having a molecular weight of 150 to 1,500 with an ordinary polyamide forming material, as proposed in JP55-74537A.

Preferred among these water-soluble polyamides are copolyamides containing a polyether segment of 150 to 1,500 in molecular weight, more particularly copolyamides containing 30 to 70 wt % of structural units consisting of a polyoxyethylene and an aliphatic dicarboxylic acid or a diamine, the polyoxyethylene having amino groups at both ends thereof and having a molecular weight of the polyether segment of 150 to 1,500.

It is optional whether the water-soluble polyamides referred to above are to be used each alone or as a mixture of two or more.

As the alcohol-soluble polymer used in the present invention it is desirable to use an alcohol-soluble polyamide in view of the compatibility between polymers or between polymers and the photopolymerizable compound. The alcohol-soluble polyamide is usually a non-graft or unmodified polymer which is classified separately from an alcohol-soluble, modified nylon obtained by chemically modifying an N-alkoxymethylated nylon which will be described later.

As examples of the alcohol-soluble polyamide used in the present invention there are mentioned linear polyamides prepared from a dibasic aliphatic carboxylic acid and a diamine, an ω-amino acid, a lactam, or a derivative thereof in a known manner. Not only homopolymers but also random copolymers and block copolymers are employable. Further employable are polyamides having a substituent group on the main chain-constituting carbon atom or nitrogen atom, as well as polyamides containing other bonds than C—C and —C—N—CO— bonds in the main chain. Typical examples are nylon 3, 4, 5, 6, 8, 11, 12, 13, 66, 610, 6/10, 13/13, polyamides prepared from m-xylylenediamine and adipic acid, polyamides from trimethylhexamethylenediamine or isophoronediamine and adipic acid, ε-caprolactam/adipic acid/hexamethylenediamine/4,4'-diaminodicyclohexylmethane copolyamide, ε-caprolactam/adipic acid/hexamethylenediamine/ 2,4,4'-trimethylhexamethylenediamine copolyamide, ε-caprolactam/adipic acid/hexamethylenediamine/isophoronedi-amine copolyamide, polyamides containing these components, and N-methylol or N-alkoxymethyl derivatives thereof.

It is optional whether these alcohol-soluble polyamides are to be used each alone or as a mixture of two or more.

The proportion of the soluble polymer in the photosensitive resin composition is preferably in the range of 20 to 70 wt %, more preferably 30 to 60 wt %. If it is less than 20 wt %, the surface of the resulting composition will be soft and sticky, so in the case of using the composition as a printing plate, it is impossible to effect vacuum adhesion of an image-bearing film uniformly onto the photosensitive layer and hence impossible to effect uniform printing of images. Additionally, a waste effort is required for removing the image-bearing film, and the film surface is often damaged, so that it is impossible to obtain desirable results. Further, because the proportion of the photopolymerizable monomer becomes too high, there arise problems such as an increase in hardness of the printing plate after exposure and plate making and the resulting development of cracks in the plate surface during printing, thus making it impossible to obtain satisfactory prints.

On the other hand, if the proportion of the soluble polymer in the photosensitive composition is more than 70 wt %, the density of a crosslinked structure of the resulting printing plate material will be very low because of a shortage in the absolute amount of polymerizable monomers necessary for photopolymerization reaction. As a result, the water resistance of a photoinsolubilized portion is inferior and the image reproducibility is deteriorated. Further, swelling of the printing plate surface in aqueous resin coating or aqueous varnish printing occurs to a greater extent, thus causing troubles such as it being impossible to obtain satisfactory prints.

As to the ratio of the water-soluble polymer and the alcohol-soluble polymer in the soluble polymer, it is preferably in the range of 25/75 to 85/15 in terms of (water-soluble polymer)/(alcohol-soluble polymer).

As to the proportion of the water-soluble polyamide including a water-soluble, modified nylon, if any, it is preferred that the total amount be in the range of 30 to 80 wt %, more preferably 40 to 70 wt %, in the soluble polymer.

If the proportion of the water-soluble polymer, e.g. water-soluble polyamide, contained in the soluble polymer is small, the solubility of the photosensitive resin composition in neutral water will be deteriorated markedly, thus requiring a longer time for water development, or undissolved matter may remain in the printing plate material after development. On the other hand, if the amount of the water-soluble polyamide is large, the swelling property of the resulting printing plate in water will be enhanced and the solvent resistance of the printing plate to an aqueous resin or an aqueous varnish ink is deteriorated, thus making it impossible to obtain satisfactory prints.

As to the proportion of the alcohol soluble polyamide including an alcohol-soluble, modified nylon, if any, it is preferred that the total amount be in the range of 20 to 70 wt %, more preferably 30 to 60 wt %, in the soluble polymer.

If the proportion of the alcohol-soluble polymer, e.g. alcohol-soluble polyamide, contained in the soluble polymer is small, the water resistance of the resulting photosensitive resin printing material will be deteriorated markedly, so that swelling of the resulting printing plate occurs to a greater extent in printing using an aqueous resin or an aqueous varnish ink containing water as a principal component, thus causing breakage of a relief image obtained or deterioration in the quality of prints obtained. On the other hand, if the proportion of the alcohol-soluble polyamide in the soluble polymer is large, the solubility of the photosensitive polymer composition in water will be deteriorated to the extent that neutral water development is infeasible.

In the case where the polymer composition has a dispersed structure of sea-and-islands form, the alcohol-soluble polyamide contained in the soluble polymer is dispersed as islands. Thus, in the present invention, the soluble polymer as a main component of the photosensitive layer has a structure of a specific form to afford a printing plate which exhibits an excellent water developability as a photosensitive resin printing plate material and which has a water resistance high enough to withstand aqueous resin printing. The "specific form" as referred to herein means that the photosensitive layer has a dispersed structure of sea-and-islands form. This is fundamentally different from the structure of conventional photosensitive polymer printing plate material which is basically uniform.

According to one of preferred embodiments of the invention, a water-soluble, modified nylon (so referred to hereinafter) obtained by chemically modifying an N-alkoxymethylated nylon to impart water solubility thereto is used as the water-soluble polymer, whereby the image reproducibility and water resistance of a relief image of the resulting photosensitive polymer printing plate material can be improved remarkably while maintaining the neutral water developability of the photosensitive resin composition. This is presumed to be because the dispersibility of the alcohol-soluble polyamide contained as island component in the soluble polymer is improved to make the islands into fine particles, thereby making it possible to effect close filling of the islands. This effect is observed also in the case of a homogeneous system, like the sea-and-islands dispersed structure.

The water-soluble, modified nylon used in the present invention usually indicates a modified nylon obtained by introducing a hydrophilic group into an N-alkoxymethylated nylon which is alcohol-soluble to render it water-soluble.

N-alkoxymethylated nylon is a polyamide wherein an alkoxymethyl group is bonded to a nitrogen atom constituting the polyamide and usually may be prepared by reacting formaldehyde and methanol with a conventional nylon such as nylon 3, 4, 5, 6, 8, 11, 12, 13, 66 and 610, with nylon 6 being most preferable. The N-alkoxymethylated ratio i.e. the ratio of alkoxymethylated N atoms to the total N atoms, is preferably 15 to 50%. As examples of the N-alkoxymethylated nylon there are mentioned N-methoxymethylated nylon N-ethoxymethylated nylon and N-butoxymethylated nylon. As an example of a hydrophilic group introducing method there is mentioned the reaction of an N-alkoxymethylated nylon and a compound having a hydrophilic group. Preferred examples of hydrophilic groups include hydroxyl, carboxyl and amido groups.

According to one method, a vinyl monomer having a hydrophilic group is graft-polymerized onto an N-alkoxymethylated nylon, as disclosed in JP60-245634A. As examples of solvents employable in this graft polymerization are mentioned lower alcohols, which may be branched, such as methanol, ethanol, propanol and butanol, mixed solutions of alcohols and calcium chloride, and formic acid. Examples of hydrophilic vinyl monomers are acrylic acid, methacrylic acid, hydroxyethyl acrylate, hydroxyethyl methacrylate, polyethylene glycol monomethacrylate, itaconic acid, acrylamide, N-methylolacrylamide, and mixtures thereof. As a catalyst to be used in the graft polymerization there may be used one which is usually employed for radical polymerization reaction such as, for example, azobisisobutyronitrile or benzoyl peroxide.

The water soluble, modified nylon obtained by graft-polymerizing a hydrophilic vinyl monomer onto a N-alkoxymethylated nylon usually has a structure wherein the grafted branches are bonded to methylene chains constituting the N-alkoxymethylated nylon. The number of grafted sites is preferably 20 to 100%, more preferably 30 to 80%, most preferably 30–60% based on the number of amide bondings in the N-alkoxy ethylated nylon.

In the case where a vinyl monomer having a carboxyl group is used as a graft monomer, the obtained graft polymer can be made more soluble in water by the addition of, for example, ammonia, sodium hydroxide, potassium hydroxide, sodium carbonate or sodium hydrogencarbonate.

Such water-soluble, modified nylons may each be used alone, or they may be used as a mixture of two or more.

Although only a water-soluble, modified nylon may be used as the water-soluble polymer, it is desirable to use it in combination with another water-soluble polymer typified by the foregoing water-soluble polyamides.

In the case of using such a water-soluble, modified nylon, the amount thereof is preferably in the range of 5 to 70 wt %, more preferably 1 to 40 wt %, in the water-soluble polymer.

According to another preferred embodiment, an alcohol-soluble, modified nylon is used as the alcohol-soluble polymer. Also in this case there can be attained the effect of the invention.

More particularly, by using an alcohol-soluble, modified nylon as the alcohol-soluble polymer, the image reproducibility and water resistance of a relief image of the resulting photosensitive polymer printing plate material can be improved to a remarkable extent while retaining the neutral water developability of the photosensitive polymer composition, as is the case with the use of a water-soluble, modified nylon. This is presumed to be because the dispersibility of the alcohol-soluble polyamide contained as islands in the soluble polymer is improved to make all the islands into fine particles, thereby permitting close filling of the islands. The same effect is attained also in the case of a homogeneous system.

The alcohol-soluble, modified nylon indicates an N-alkoxymethylated nylon or a modified nylon obtained by introducing a small amount of a hydrophilic group in to the N-alkoxymethylated nylon. If a hydrophilic group is introduced in a large amount, modification into water solubility will result as noted previously, so the amount of a hydrophilic group to be introduced should be in a range not causing such modification into water solubility.

Also in this case, such an alcohol-soluble, modified nylon alone may be used as the alcohol-soluble polymer, but it is desirable to use it in combination with another alcohol-soluble polymer typified by the foregoing alcohol-soluble polyamides.

In the case of using an alcohol-soluble, modified nylon, the amount thereof is preferably in the range of 10 to 70 wt %, more preferably 20 to 50 wt %, in the alcohol-soluble polymer.

Such water-soluble, modified nylon or alcohol-soluble, N-alkoxymethylated nylon-modified polymer in the soluble polymer is used in such a manner that the total amount thereof is preferably in the range of 3 to 70 wt %, more preferably 5 to 40 wt %, in the soluble polymer.

As the soluble polymer, polymers other than polyamides is also employable in combination with the foregoing soluble polyamide. As examples of such employable polymer other than polyamides are mentioned, as alcohol-soluble polymers, poly(meth)acrylates, polyvinyl butyral, epoxy resins, phenolic resins, polyvinyl acetate, urea resins, melamine resins, and condensates of methyl vinyl ether and acid anhydrides, and, as water-soluble polymers, polyvinyl alcohol, polyvinylpyrrolidone and cellulose, provided there is made no limitation thereto.

In the case of using any of such polymers in combination with the foregoing soluble polyamide, if the amount thereof is too large relative to the polyamide component, the compatibility of the photosensitive resin composition will be deteriorated, thus causing the photosensitive characteristic of the composition to be impaired. In view of this point it is preferred that the amount of the polymer in question be not larger than 20 wt % of the total amount of both water-soluble polyamide and alcohol-soluble polyamide.

Polymers having neither water-solubility nor alcohol-solubility are also employable as necessary as long as they do not affect the object and effect of the present invention.

As the photopolymerizable compound having an ethylenic double bond in the molecule used in the invention there may be employed a known one having a certain or higher compatibility with the soluble polymer used in the invention.

Examples are monoacrylates and monomethacrylates both having a hydroxyl group such as 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, 3-chloro-2-hydroxypropyl acrylate and 3-chloro-2-hydroxypropyl methacrylate; polyvalent acrylates and methacrylates obtained by the reaction of polyhydric alcohols and unsaturated carboxylic acid such as acrylic acid and methacrylic acid; unsaturated epoxy compounds such as glycidyl acrylate, glycidyl methacrylate, 3,4-epoxycyclohexyl acrylate and 3,4-epoxycyclohexyl methacrylate; polyvalent acrylates and methacrylates having a hydroxyl group(s) and prepared by the reaction of polyhydric glycidyl ethers such as ethylene glycol diglycidyl ether and unsaturated carboxylic acids such as acrylic acid and methacrylic acid; polyvalent acrylates and methacrylates having a hydroxyl group and prepared by the reaction of unsaturated epoxy compounds such as glycidyl methacrylate and unsaturated carboxylic acids such as acrylic acid and methacrylic acid; and acrylamide type photopolymerizable monomers such as polyvalent acrylamides and methacrylamides prepared by the condensation reaction of acrylamide, methacrylamide, N-methylolacrylamide, N-methylolmethacrylamide, diacetone acrylamide, methylenebisacrylamide, N-methylolacrylamide or N-methylolmethacrylamide with polyhydric alcohols. Particularly, hydroxyl-containing acrylic or methacrylic acid esters and acryl- or methacrylamides are preferred.

The proportion of the photopolymerizable compound in the photosensitive resin composition is preferably in the range of 30 to 70 wt %. If it is less than 30 wt %, the composition will becomes easier to swell against a diluting solvent in an aqueous varnish consisting principally of water due to insufficient density of a crosslinked structure formed by photopolymerization, thus resulting in that swelling and destruction of a solid portion and consequent poor printing are apt to occur during printing. Further, a satisfactory image reproducibility is not obtained due to a low crosslink density. If a photopolymerizable compound having a higher crosslinkability is used for attaining a higher image reproducibility, the hardness of a machine plate using this printing plate material will become high, causing deterioration of ink receptivity for the object to be printed and thus making it no longer possible to obtain good prints.

Conversely, if the proportion of the photopolymerizable compound in the photosensitive resin composition exceeds 70 wt %, the crosslink density will become too high, thus giving rise problems such as a relief image obtained being very fragile and so being cracked during printing.

As the photopolymerization initiator used in the present invention there may be employed any of the conventional, known photopolymerization initiators. Examples are benzoin alkyl ethers, benzophenones, anthraquinones, benzils, acetophenones and diacetyls. The amount of the photopolymerization initiator used is in the range of 0.01 to 10 wt % based on the total weight of the photosensitive resin composition.

A compatibilizing aid for both soluble polymer and photopolymerizable compound may be incorporated in the photosensitive resin composition of the present invention. Examples are polyhydric alcohols such as ethylene glycol, diethylene glycol, triethylene glycol, glycerein, trimethylolpropane and trimethylolethane, as well as N-ethyl-p-toluenesulfonamide, N-butylbenzenesulfonamide and methylbenzenesulfonamide. These polyhydric alcohols and sulfonamide compounds exhibit the effect of enhancing the flexibility of the photopolymerized portion to prevent cracking of a relief image obtained. The amount thereof is not larger than 30 wt % relative to the photosensitive resin composition.

For improving the thermal stability of the composition there may be used a known polymerization inhibitor. Preferred examples are phenols, hydroquinones and catechols. The polymerization inhibitor may be used in an amount in the range from 0.01 to 5 wt % based on the total weight of the composition. There also may be added dye, pigment, surfactant, defoaming agent, ultraviolet ray absorber and perfume.

The composition of the present invention is prepared usually by a method comprising dissolving a soluble polymer (e.g. a water-soluble polyamide and an alcohol-soluble polyamide) and, if necessary, a water- or alcohol-soluble, modified nylon in a mixed water/alcohol solvent under heating, then, where required, adding an unsaturated epoxy compound to form a polymerizable unsaturated bond at a polymer end, subsequently adding a photopolymerizable compound, a photopolymerization initiator and a heat stabilizer, followed by stirring and thorough mixing. In this way there is obtained a solution of a photosensitive polymer composition.

From the above mixed solution there can be formed a photosensitive layer, for example, by distilling out the bulk of the solvent, subsequent heating into a melted state and extruding the melt onto a substrate, or by first forming a photosensitive sheet according to a dry film forming method and then bonding the sheet onto a substrate, or by forming film directly on a substrate according to a dry film forming method. As the substrate there may be used a metallic sheet such as steel, stainless steel, aluminum or copper sheet, a plastic sheet such as polyester film, or a synthetic rubber sheet such as styrene-butadiene copolymer sheet. It is preferred that the photosensitive layer be formed to a thickness of 0.01 to 10 mm.

Using the photosensitive resin composition of the present invention, a printing plate is formed by bringing a negative or positive image-bearing film into close contact with the upper surface of the photosensitive layer formed as above, then radiating an ultraviolet light to the photosensitive layer through the film from a high pressure mercury vapor lamp, an ultra-high pressure mercury vapor lamp, a metal halide lamp, a xenon lamp, a carbon arc lamp or a chemical lamp mainly of 300 to 400 nm in wavelength, allowing photopolymerization to take place for insolubilization, and subsequently dissolving out unpolymerized portion into water by means of a spray type or brush type developing apparatus using neutral water to form a relief image on the substrate.

The photosensitive composition of the present invention can afford a photosensitive resin printing plate material having high water-developability and image reproducibility and which can be utilized in aqueous polymer coating. Particularly, in printing using an aqueous varnish, the printing plate material exhibits a high printing durability and permits glazing for the surfaces of prints to a satisfactory extent.

This is because the photosensitive polymer composition itself is rendered water-developable by the water-soluble polyamide and water-soluble, modified nylon both incorporated at a certain ratio in the soluble polymer and the resistance to an aqueous varnish ink comprising a solvent of mainly water and a resin dissolved therein is improved remarkably by the alcohol-soluble polyamide which is a soluble polymer insoluble in water. Besides, since polyamides are mainly used as soluble polymers, the durability in aqueous resin coating can be further improved by the toughness of the polymers coupled with the improved water resistance of the photosensitive polymer printing plate material.

Further, by adding unsaturated epoxy compounds it is made possible to introduce polymerizable unsaturations to ends of those soluble polymers (modified nylon and other soluble polymers). As a result, by the photopolymerization reaction with the photopolymerizable compound there is formed a relief image having a halftone structure of a higher density and which relief image possesses an excellent water resistance and can retain a high degree of image reproducibility. Besides, since the relief image is tough, it is possible to prevent the occurrence of problems such as the development of cracks during printing.

The photosensitive polymer composition of the present invention exhibits its effect to the greatest extent when used as a relief printing plate material, but it is also possible to use it as the material of planographic, intaglio and stencil printing plates.

EXAMPLES

The present invention will be described below more concretely by way of examples thereof. The following materials were used in those examples.

Water-soluble Polymer

A-1:

A polyamide having a relative viscosity (1 g of polymer was dissolved in 100 ml of chloral hydrate and then measured at 25° C., also in the following) of 2.50, prepared by melt-polymerizing under ordinary conditions 55 parts by weight of an equimolar salt of adipic acid and α, ω-diaminopolyoxyethylene obtained by adding acrylonitrile to both ends of polyoxyethylene having a number average molecular weight of 600 and subsequent reduction with hydrogen, 25 parts by weight of ε-caprolactam and 20 parts by weight of an equimolar salt of hexamethylenediamine and adipic acid.

A-2:

A water-soluble, modified nylon prepared by graft-polymerizing acrylic acid as a hydrophilic vinyl monomer onto a methoxymethylated nylon in which 30% of nitrogen atoms are methoxymethylated and converting the graft polymer thus obtained to the corresponding ammonium salt. The number of grafted sites was 30% based on the number of amide bondings.

A-3:

A polyamide prepared by melt-polymerizing under ordinary conditions 50 parts by weight of an equimolar salt of adipic acid and α, ω-diaminopolyoxyethylene obtained by adding acrylonitrile to both ends of polyoxyethylene having a number average molecular weight of 400 and subsequent reduction with hydrogen and 50 parts by weight of ε-caprolactam.

A-4:

A water-soluble, modified nylon prepared by graft-polymerizing acrylic amide as a hydrophilic vinyl monomer onto a methoxymethylated nylon in which 30% of nitrogen atoms are methoxymethylated. The number of grafted sites was 50% based on the number of amide bondings.

A-5:

A polyamide prepared by melt-polymerizing under ordinary conditions 65 parts by weight of an equimolar salt of α, ω-diaminopolyoxyethylene obtained by adding acrylonitrile to both ends of polyoxyethylene having a number average molecular weight of 1,000 and subsequent reduction with hydrogen and 35 parts by weight of ε-caprolactam.

A-6:

A copolyamide prepared by stirring 30 parts by weight of ε-caprolactam, 36 parts by weight of an equimolar salt of hexamethylenediamine and adipic acid, 14 parts by weight of dimethyl isophthalate, 8 parts by weight of dimethylisophthalae-5-sulfonate, sodium salt, 12 parts by weight of hexamethylenediamine and 8 parts by weight of water at 130° C. for 8 hours under nitrogen flow and subsequent reaction at 270° C. for 5 hours.

A-7:

A polyamide prepared by copolymerizing 50 parts by weight of N,N'-bis(γ-aminopropyl)piperazine adipate and 50 parts by weight of ε-caprolactam, then adding 15 parts by weight of acrylic acid and allowing reaction to take place under heating to effect quaternization.

Alcohol-soluble Polymer

B-1:

A copolyamide (Toray CM-8000) comprising nylon 6/66/610/12 (=45/25/25/15 weight ratio).

B-2:

Methoxymethylated compound of nylon 6 (degree of methoxymethylation: 30%) (classified as an alcohol-soluble modified nylon)("Toresin" MF-30, a product of Teikoku Chemical Industries).

B-3:

A copolyamide (Toray CM-4000) comprising nylon 6/66/610 (=45/35/25 weight ratio).

B-4:

A copolyamide (Toray CM-9000) comprising nylon 6/66/<bis(p-aminocyclohexyl)methane><adipic acid> (=1/1/1 weight ratio).

TABLE 1

Composition of Polymer Solution

| | Water-Soluble Polymer | | Alcohol-Soluble Polymer | | Solvent | |
|---|---|---|---|---|---|---|
| | material | Parts by weight | material | Parts by weight | ethanol/water weight ratio | Parts by Weight |
| Ex. 1 | A-1 | 35 | B-1 | 55 | 60/40 | 160 |
| | A-2 | 10 | | | | |
| Ex. 2 | A-3 | 30 | B-2 | 25 | 70/30 | 120 |
| | A-4 | 20 | B-3 | 25 | | |
| Ex. 3 | A-5 | 45 | B-1 | 50 | 80/20 | 150 |
| | A-2 | 5 | | | | |
| Ex. 4 | A-6 | 40 | B-1 | 30 | 50/50 | 150 |
| | A-2 | 10 | B-4 | 20 | | |
| Com. Ex. 1 | A-6 | 40 | B-1 | 30 | 50/50 | 150 |
| | | | B-4 | 20 | | |
| Com. Ex. 2 | A-6 | 40 | B-1 | 15 | 50/50 | 150 |
| | | | B-4 | 10 | | |
| Ex. 5 | A-7 | 35 | B-2 | 20 | 70/30 | 120 |
| | A-4 | 5 | B-3 | 40 | | |

Using the above materials, the materials described in Table 1 were dissolved at 80° C. to prepare polymer solutions in the following examples.

Example 1

2 parts by weight of glycidyl methacrylate was added into the polymer solution shown in Table 1 and reaction was allowed to take place at 80° C. for 1 hour, allowing the epoxy group of the glycidyl methacrylate to react with the amino and carboxyl groups at polyamide end to introduce methacryloyl group into the polyamide end. Subsequently, there were added and thoroughly stirred and mixed 20 parts by weight of an adduct of propylene glycol diglycidyl ether and acrylic acid, 50 parts by weight of an adduct of xylylenediamine and glycidyl methacrylate and 30 parts by weight of β-hydroxyethyl-β'-acryloyloxyethyl phthalate, as polymerizable unsaturated compounds, further, 2 parts by weight of dimethylbenzyl ketal as a photopolymerization initiator, and 0.1 part by weight of hydroquinonemonomethyl ether and 3 parts by weight of sodium methylenebisnaphthalenesulfonate, as thermal polymerization inhibitors.

The photosensitive resin composition thus obtained as a solution was spread over a 250 μm thick steel substrate to a thickness after drying of 950 μm including the thickness of the substrate to which substrate had been applied and cured an epoxy adhesive. The substrate was then placed in a hot-air oven at 60° C. for 3 hours to remove the solvent completely. Then, a mixed solvent of ethanol/water (80/20 weight ratio) was applied thin to the surface of the photosensitive layer thus formed, followed by pressure-contact therewith of a 100 μm thick polyester film which had been matted by chemical etching, and a cover film was applied, to afford a photosensitive polymer printing plate material.

This printing plate material was observed using a scanning electron microscope (JSM-T300, a product of Japan Electron Optics Laboratory Co., Ltd., measurement condition: reflected electron composition image) to find that it had a sea-and-islands dispersed structure comprising sea of the water-soluble polymer and islands of the alcohol-soluble polymer and that island spheres ranged in diameter from 0.5 to 4 microns. FIG. 1 shows the result.

After this printing plate material had been stored in a dark place for 10 days, the cover film was peeled off and a gray-scale negative film for sensitivity measurement and a negative film for image reproducibility test (133 lines, 3%, 5% and 10% halftone dots, 200 and 300 μm dia. independent dots, 50 and 70 μm wide fine lines) were vacuum-adhered to the photosensitive layer of the printing plate material, then exposed to light for 2 minutes using a high-pressure mercury vapor lamp. Subsequently, development was conducted at a water pressure of 3 kg/cm$^2$ using a spray type developing apparatus containing neutral water held at 30° C. In 3 minutes, the non-image area was completely dissolved out into water, leaving a relief image. The relief image was examined to find that up to 17 steps remained in the gray scale portion. Thus, the printing plate material proved to be very high in sensitivity. It turned out that 3% halftone dots, 200 μm independent dots and 50 μm fine lines were reproduced sharply in the printing area.

The printing plate thus obtained was subjected to a printing test using a varnishing ink "LITHCOAT" 300A Varnish (a product of Toyo Ink Mfg. Co., Ltd.). As a result, there were obtained sharp prints free of thickening. The printing was continued up to 700,000 prints, but there arose no such problems as peeling of the relief image and cracking.

Example 2

3 parts by weight of glycidyl methacrylate and 0.5 part by weight of triethanolamine were added into the polymer solution shown in Table 1 and reaction was allowed to take place for about 1 hour. Then, 50 parts by weight of 2-acryloyloxyethyl-2-hydroxyethylphthalic acid and 20 parts by weight of phenoxypolyethylene glycol acrylate were added as photopolymerizable compounds and stirring and mixing were performed to a thorough extent. Further, 10 parts by weight of diethylene glycol, 1.5 parts by weight of benzoin methyl ether as a photopolymerization initiator, and 0.01 part by weight of hydroquinone as a heat stabilizer were added, followed by stirring and mixing to a thorough extent.

The photosensitive resin composition thus obtained as a solution was spread over a 250 μm thick steel sheet to a thickness after drying of 1,300 μm to which steel sheet had been applied an epoxy adhesive. Then the steel sheet was placed in a hot-air oven at 60° C. for 6 hours to remove the solvent completely. Subsequently, a mixed ethanol/water solvent (70/30 weight ratio) was applied thin to the surface of the photosensitive layer thus formed, followed by pressure-contact therewith of a 100 μm thick polyester film which had been matted by chemical etching, and a cover film was applied, to afford a photosensitive polymer printing plate material.

This printing plate material was observed in the same way as in Example 1 to find that it had a beautiful sea-and-islands dispersed structure comprising sea of the water-soluble polymer and islands of the alcohol-soluble polymer and that island spheres ranged in diameter from 0.2 to 5 microns.

Then, the gray-scale negative film for sensitivity measurement and the negative film for image reproducibility test both used in Example 1 were vacuum-adhered to the printing plate material thus obtained, and exposed to light for 1 minute using an ultra-high pressure mercury vapor lamp. Thereafter, development was conducted by means of a brush type developing apparatus containing neutral water of 25° C. In 4 minutes, the non-image area was completely dissolved out into water, leaving a relief image.

Upon examination of the relief image it turned out that up to 16 steps remained in the gray scale portion and that the printing plate material was thus very high in sensitivity. Further, it turned out that 3% halftone dots, 200 μm independent dots and 50 μm fine lines were reproduced sharply in the printing area.

Using the printing plate thus obtained, a printing test was conducted and as a result there were obtained sharp prints free of thickening. The printing was continued up to 300,000 prints, but no crack was developed in the printing plate material. Further, using a machine plate formed of this printing plate material and also using an aqueous varnishing ink "AC Coat" PV500 (a product of Sakata Inks), printing was performed for the surfaces of prints after ordinary color printing. As a result, there could be obtained good prints superior in surface gloss. The printing was continued up to 400,000 prints, but there occurred no such problems as chipping of the machine plate and thinning of the prints.

Example 3

1 part by weight of glycidyl methacrylate was added into the polymer solution shown in Table 1 and reaction was allowed to take place at 80° C. for 1 hour. From the results of analysis obtained by a potentiometric titration method it turned out that the carboxyl group at polyamide end had been extinguished and that unsaturated bond had been introduced in the polymer side chain by reaction with the epoxy group of the glycidyl methacrylate. Then, as photopolymerizable compounds there were added 30 parts by weight of polyethylene glycol diacrylate and 40 parts by weight of an unsaturated compound prepared by an addition reaction of glycidyl methacrylate and acrylic acid, further, 20 parts by weight of N-ethyl-p-toluenesulfonamide as a plasticizer, 3 parts by weight of benzyl dimethyl ketal as a photopolymerization initiator and 0.1 part by weight of t-butylcatechol as a heat stabilizer were added and stirring and mixing were conducted to a thorough extent.

The printing plate material thus obtained was observed in the same way as in Example 1 to find that it had a beautiful sea-and-islands dispersed structure comprising sea of the water-soluble polymer and islands of the alcohol-soluble polymer and that island spheres ranged in diameter from 1 to 4 microns.

The photosensitive polymer composition thus obtained as a solution was spread over a 185 μm thick polyester film substrate to a thickness after drying of 1,300 μm (including the substrate thickness) to which substrate a polyester adhesive had been applied and then cured by heat and light. The substrate was then placed in a hot-air oven at 60° C. for 5 hours to remove the solvent completely. In this way there was obtained a photosensitive polymer printing plate material.

Using this printing plate material and the same negative film as that used in Example 1, exposure was conducted for 4 minutes by means of a chemical lamp, followed by development in a brush type developing apparatus containing neutral water of 30° C.

The development required 4 minutes. Upon examination of a relief image obtained it turned out that up to 16 steps remained in the gray scale portion, thus proving high sensitivity of the printing plate material, and that 50 μm fine lines were also reproduced without any trouble.

A printing test was conducted using the printing plate thus obtained and also using a varnishing ink "HYDLITH" 2012-S (a product of Dainippon Ink & Chemicals Inc.). As a result, there were obtained prints free of thickening and superior in surface gloss. The printing was continued up to 200,000 prints, but there arose no such problems as peeling of the relief image and cracking.

Example 4

80 parts by weight of 2-hydroxyethyl methacrylate, 40 parts by weight of N-methylolacrylamide and 40 parts by weight of ethylene glycol diacrylate were added as photopolymerizable compounds into the polymer solution shown in Table 1. Further, 3 parts by weight of benzophenone as a photopolymerization initiator and 0.01 part by weight of phenothiazine as a heat stabilizer were added and stirred and mixing were conducted to a thorough extent. The photosensitive polymer composition thus obtained as a solution was spread over an aluminum substrate to a thickness after drying of 1,000 μm to which substrate had been applied an epoxy adhesive. Then, the substrate was placed in a hot-air oven at 60° C. for 3 hours to remove the solvent, leaving a photosensitive polymer printing plate material.

This printing plate material was observed in the same way as in Example 1 to find that it had a sea-and-islands dispersed structure comprising sea of the water-soluble polymer and islands of the alcohol-soluble polymer and that island spheres ranged in diameter from 3 to 10 microns.

Then, the printing plate material was exposed to light under the same conditions as in Example 1 and thereafter subjected to development using a brush type developing apparatus. In about 2 minutes unexposed area was removed completely. Upon examination of a relief image obtained, it turned out that up to 17 steps remained in the gray scale portion, thus proving high sensitivity of the printing plate material, that the relief image was sharp and that 3% halftone dots, 200 μm independent dots and 50 μm fine lines were all reproduced completely. Also in a printing test conducted using an aqueous varnishing ink "Aquapack Varnish" F-22 (a product of Toka Shikiso), there occurred no such problems as peeling of the relief image and cracking in a continuous printing of 500,000 prints.

Comparative Example 1

A study was made without adding 10 parts by weight of the water-soluble, modified nylon in Example 4. In the same manner as in Example 4, 2-hydroxyethyl methacrylate, N-methylolacrylamide, ethylene glycol diacrylate, benzophenone and phenothiazine were added into the polymer solution shown in Table 1. Subsequently, a photosensitive resin printing plate material was obtained under the same conditions as in Example 4.

Figure 2:
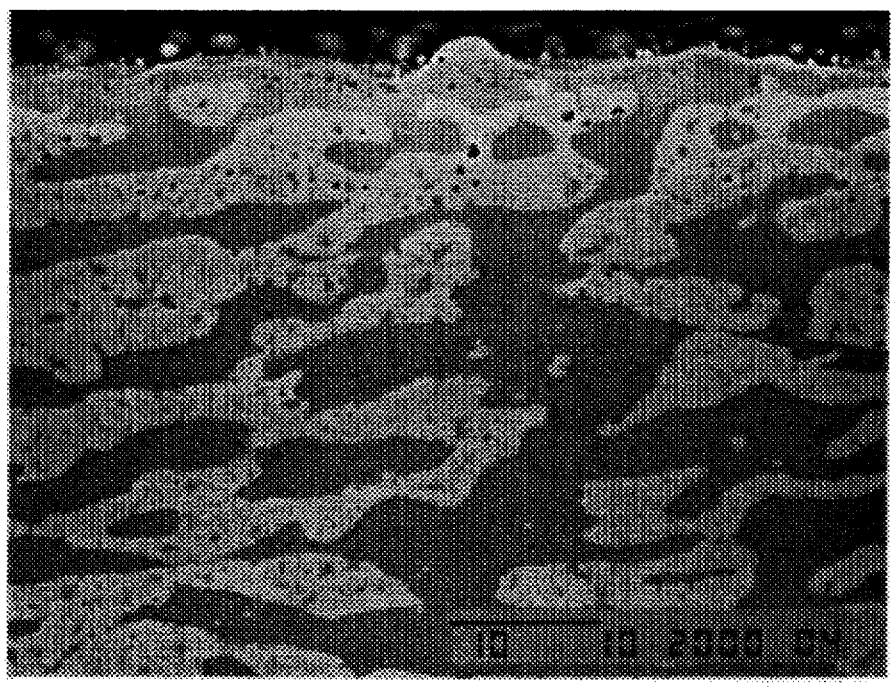
FIG. 2 is a photograph showing the dispersed structure of the printing plate material in Comparative Example 1 observed using a scanning electron microscope (×2,000).

This printing plate material was observed in the same way as in Example 1 to find that islands of the alcohol-soluble polymer could not afford a complete sea-and-islands dispersed structure, that the islands were linked together. FIGS. 2 shows the result.

Then, under the same conditions as in Example 1 the printing plate material was subjected to exposure and subsequent development using a brush type developing apparatus. Even after 30 minutes or more, unexposed area was not removed completely and the alcohol-soluble polyamide remained like streaks. Thus, there was not obtained a machine plate employable practically. For this reason, a printing test was not conducted.

Comparative Example 2

A photosensitive polymer solution was prepared in the same way as in Comparative Example 1 except that the amount of the alcohol-soluble polyamide was decreased, that is, the composition shown in Table 1 was adopted, because of poor neutral water-developability in Comparative Example 1. Using this solution, there was obtained a printing plate material under the same conditions as in Example 3.

Figure 3:
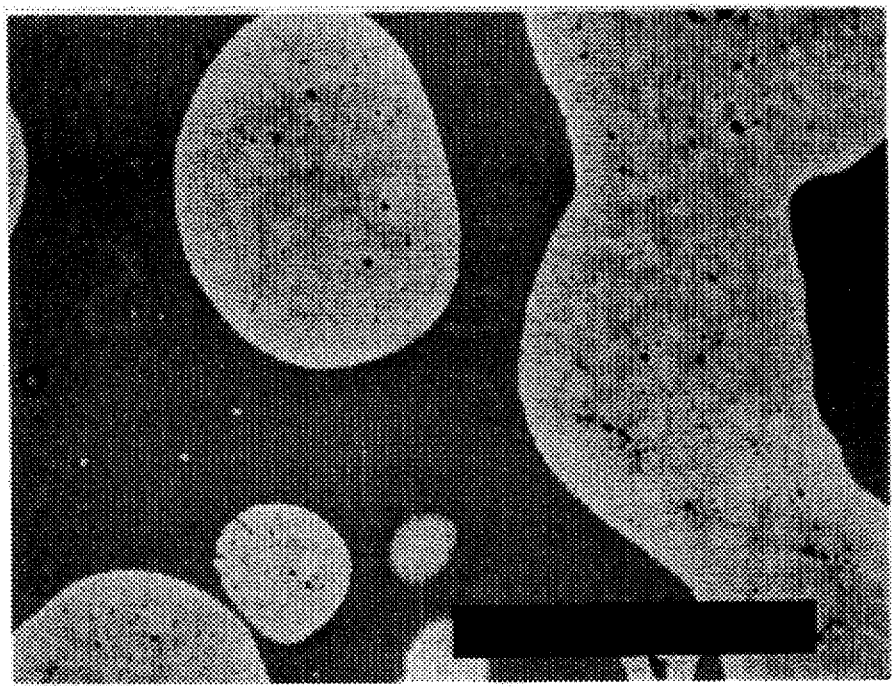
FIG. 3 is a photograph showing the dispersed structure of the printing plate material in Comparative Example 2 observed using a scanning electron microscope (×2,000).

This printing plate material was observed in the same way as in Example 1 to find that most of the alcohol soluble polymer islands had diameter greater than 20 microns and some of them were linked together. FIG. 3 shows the result.

Then, under the same conditions as in Example 1 the printing plate material was subjected to exposure and subsequent development using a brush type developing apparatus. In about 15 minutes, unexposed area was removed and a relief image could be obtained. Upon examination of the relief image it turned out that up to 16 steps remained in the gray scale portion, thus providing high sensitivity of the printing plate material, that such fine portions as 3% halftone dots, 200 μm independent dots and 50 μm fine lines were not reproduced in the printing area and that the particles of the alcohol-soluble polyamide were projecting from the side portion of the relief image. Thus, the relief image was not sharp.

Further, using a printing plate formed of this printing plate material and also using an aqueous varnishing ink "AC Coat" PV500 (a product of Sakata Inks), printing was conducted for the surfaces of prints after ordinary color printing. When the printing was continued up to 10,000 to 20,000 prints, printing plate was swollen by the water contained in the ink solvent, and the prints exhibited thickening and became dull. When the printing was further continued up to about 30,000 prints, there occurred chipping of the printing plate and the prints were not satisfactory.

Example 5

2 parts by weight of glycidyl methacrylate was added into the polymer solution shown in Table 1 and reaction was allowed to take place for about 1 hour. Then, 50 parts by weight of 2-acryloyloxyethyl-2-hydroxyethylphthalic acid and 50 parts by weight of phenoxypolyethylene glycol acrylate were added as photopolymerizable compounds, and stirred and mixing were conducted to a thorough extent. Further, 20 parts by weight of N-butylbenzenesulfonamide, 1.5 parts by weight of benzyl dimethyl ketal as a photopolymerization initiator and 0.01 part by weight of hydroquinone as a heat stabilizer were added, followed by thorough stirring and mixing.

A photosensitive polymer composition thus obtained as a solution was observed in the same way as in Example 1 to find that it had a beautiful sea-and-islands dispersed structure comprising sea of the water-soluble polymer and islands of the alcohol-soluble polymer and that island spheres ranged from 1.5 to 5 microns in diameter.

Next, this solution was spread over a 350 μm thick polyester film substrate to a thickness after drying of 1,300 μm (including the substrate thickness) to which substrate a polyester adhesive had been applied and then cured by heat and light. The substrate was then placed in a hot-air oven at 60° C. for 4 hours to remove the solvent completely. A mixed ethanol/water solvent (70/30 weight ratio) was applied thin to the surface of the resulting photosensitive layer, followed by pressure contact therewith of a 100 μm polyester film which had been matted by chemical etching, and a cover film was applied, to afford a photosensitive polymer printing plate material.

Then, the gray-scale negative film for sensitivity measurement and the negative film for image reproducibility test both used in Example 1 were vacuum-adhered to the printing plate material just obtained above and exposed to light for 1.5 minutes using an ultra-high pressure mercury vapor lamp, followed by development in a brush type developing apparatus containing neutral water of 30° C. In 4 minutes, the non-image area dissolved out completely into the water and there could be obtained a relief image. When the relief image was examined, it turned out that up to 16 steps remained in the gray scale portion, thus proving high sensitivity of the printing plate material, and that such fine portions as 3% halftone dots, 200 μm independent dots 50 μm fine lines were also reproduced sharply in the printing area.

Further, a printing test was conducted using a printing plate formed of this printing plate material. As a result, there were obtained sharp prints free of thickening.

When the printing was continued up to about 300,000 prints, there occurred no problem such as cracking of the printing plate material.

Further, using a machine plate formed of this printing plate material and also using an aqueous varnishing ink "AC Coat" PV500 (a product of Sakata Inks), printing was performed for the surfaces of prints after ordinary color printing. As a result, there could be obtained good prints superior in surface gloss. The printing was continued up to 400,000 prints, but there occurred no such problems as chipping of the machine plate and thinning of the prints.

What is claimed is:

1. A photosensitive polymer composition containing as essential components (A) a soluble polymer, (B) a photopolymerizable compound having an ethylenic double bond in the molecule thereof and (C) a photopolymerization initiator, said soluble polymer comprising a sea-island structure containing a water-soluble polymer forming a sea and an alcohol-soluble polymer forming a plurality of islands having a diameter of 0.1 –20 microns which is insoluble in water, said soluble polymer being dissolved in a water/alcohol solvent, and at least a portion of said water-soluble polymer or said alcohol-soluble polymer being constituted by a modified nylon obtained by chemically grafting a hydrophilic group onto an N-alkoxymethylated nylon.

2. A photosensitive polymer composition containing as essential components (A) a soluble polymer, (B) a photopolymerizable compound having an ethylenic double bond in the molecule thereof and (C) a photopolymerization initiator, said soluble polymer comprising a water-soluble polymer and an alcohol-soluble polymer which is insoluble in water, said soluble polymer being dissolved in a water/alcohol solvent, said composition having a sea-and-islands structure comprising a sea structure containing said water-soluble polymer as a main component, and a plurality of separate islands in said sea structure, said islands containing said alcohol soluble polymer which is substantially insoluble in water as a main component, and said islands being independently in the form of spheres or ovals having a diameter of 0.1 to 20 microns, said water-soluble polymer containing a water-soluble polyamide and a water-soluble, modified nylon obtained by chemically grafting a hydrophilic group onto an N-alkoxymethylated nylon.

3. A photosensitive polymer composition as set forth in claim 2 containing 20 –70% by weight of the soluble polymer (A), 30 –70% by weight of the photopolymerizable compound (B) and 0.001 –5% by weight of the photopolymerization initiator (C), and the proportion of the water-soluble polymer and that of the alcohol-soluble polymer in the soluble polymer (A) are in the range of 25% to 85% by weight and 75% to 15% by weight, respectively, based on the weight of the soluble polymer (A).

4. A photosensitive polymer composition as set forth in claim 3, wherein said water-soluble polymer contains 95–30% by weight of the water-soluble polyamide and 5–70% by weight of the water-soluble, modified nylon.

5. A photosensitive polymer composition as set forth in claim 2, wherein said water-soluble polyamide is at least one member selected from the group consisting of polyamides having an ether linkage in the main chain, polyamides having a tertiary amino group and polyamides having a sulfonic acid group in the side chain.

6. A photosensitive polymer composition as set forth in claim 2, wherein said water-soluble, modified nylon is the reaction product of an N-alkoxymethylated nylon and a compound having a functional group selected from the group consisting of hydroxyl, carboxyl and amino groups.

7. A photosensitive polymer composition as set forth in claim 2, wherein said alcohol-soluble polymer contains an alcohol-soluble polyamide.

8. A photosensitive polymer composition as set forth in claim 2, wherein part or the whole of the ends of said soluble polymer has a polymerizable unsaturated bond.

9. A photosensitive polymer composition containing as essential components (A) a sea-island soluble polymer, (B) a photopolymerizable compound having an ethylenic double bond in the molecule there of and (C) a photopolymerization initiator, said soluble polymer comprising a water-soluble polymer forming a sea and an alcohol-soluble polymer forming a plurality of islands having a diameter of 0.1–20 microns which is insoluble in water, said soluble polymer being dissolved in a water/alcohol solvent, said alcohol-soluble polymer containing an alcohol-soluble polyamide and an alcohol-soluble, modified nylon obtained by chemically grafting a hydrophilic group onto an N-alkoxymethylated nylon.

10. A photosensitive polymer composition as set forth in claim 9, containing 20–70% by weight of the soluble polymer (A), 30–70% by weight of the photopolymerizable compound (B) and 0.01–5% by weight of the photopolymerization initiator (C), and the proportion of the water-soluble polymer and that of the alcohol-soluble polymer in the soluble polymer (A) are in the ranges of 25% to 85% by weight and 75% to 15% by weight, respectively, based on the weight of the soluble polymer (A).

11. A photosensitive polymer composition as set forth in claim 10, wherein said alcohol-soluble polymer contains 95–30% by weight of the alcohol-soluble polyamide and 5 –70% by weight of the alcohol-soluble, modified nylon.

12. A photosensitive polymer composition as set forth in claim 9, wherein said water-soluble polymer contains a water-soluble polyamide.

13. A photosensitive polymer composition as set forth in claim 12, wherein said water-soluble polyamide is at least one member selected from the group consisting of polyamides having an ether linkage in the main chain, polyamides having a tertiary amino groups and polyamides having a sulfonic acid groups.

14. A photosensitive printing plate comprising the photosensitive polymer composition claimed in any of claims 1, 2, and 9 applied onto a substrate.

* * * * *

UNITED STATES PATENT AND TRADEMARK OFFICE
CERTIFICATE OF CORRECTION

PATENT NO. : 5,688,632
DATED : 11/18/97
INVENTOR(S) : Shigetora Kashio, et al

It is certified that error appears in the above-indentified patent and that said Letters Patent is hereby corrected as shown below:

Column 4, line 19, please change "JP49-43465" to --JP49-43465A--; and at line 61, please change "isophoronedi-amine" to --isophoronediamine--

Column 7, line 5, please change "N-alkoxy ethylated" to --N-alkoxymethylated--; and at line 41, please change "in to" to --into--.

Column 17, line 62, please change "range" to --ranges--.

Signed and Sealed this

Tenth Day of February, 1998

*Attest:*

BRUCE LEHMAN

*Attesting Officer*    Commissioner of Patents and Trademarks